(12) United States Patent
Kuroda et al.

(10) Patent No.: US 10,020,160 B2
(45) Date of Patent: Jul. 10, 2018

(54) CHARGED PARTICLE BEAM DEVICE

(71) Applicant: Hitachi High-Technologies Corporation, Minato-ku, Tokyo (JP)

(72) Inventors: Koichi Kuroda, Tokyo (JP); Hajime Kawano, Tokyo (JP); Makoto Suzuki, Tokyo (JP); Yuzuru Mizuhara, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/417,887

(22) Filed: Jan. 27, 2017

(65) Prior Publication Data

US 2017/0221672 A1    Aug. 3, 2017

(30) Foreign Application Priority Data

Jan. 29, 2016 (JP) .................................. 2016-015028

(51) Int. Cl.
| | | |
|---|---|---|
| *G01N 23/00* | (2006.01) | |
| *H01J 37/00* | (2006.01) | |
| *H01J 3/10* | (2006.01) | |
| *H01J 37/147* | (2006.01) | |
| *H01J 37/244* | (2006.01) | |
| *H01J 37/28* | (2006.01) | |

(52) U.S. Cl.
CPC .......... *H01J 37/147* (2013.01); *H01J 37/244* (2013.01); *H01J 37/28* (2013.01); *H01J 2237/2806* (2013.01); *H01J 2237/2815* (2013.01)

(58) Field of Classification Search
USPC .... 250/306, 307, 309, 310, 396 R, 397, 398
See application file for complete search history.

(56) References Cited

U.S. PATENT DOCUMENTS

| | | | | |
|---|---|---|---|---|
| 4,939,371 A | * | 7/1990 | Goto ....................... | H01J 37/04 250/397 |
| 8,735,816 B2 | * | 5/2014 | Nakayama ............. | G01B 15/00 250/252.1 |
| 9,019,362 B2 | * | 4/2015 | Bai ........................ | H01J 37/244 250/307 |
| 2006/0243906 A1 | * | 11/2006 | Fukada ............... | G01N 23/2251 250/307 |

(Continued)

FOREIGN PATENT DOCUMENTS

| | | |
|---|---|---|
| JP | 5391252 B2 | 1/2014 |
| JP | 5669896 B2 | 2/2015 |

*Primary Examiner* — Bernard Souw
(74) *Attorney, Agent, or Firm* — Crowell & Moring LLP

(57) ABSTRACT

An object of the present invention is to provide a charged particle beam device which can realize improved contrast of an elongated pattern in a specific direction, such as a groove-like pattern. In order to achieve the above-described object, the present invention proposes a charged particle beam device including a detector for detecting a charged particle obtained based on a charged particle beam discharged to a sample. The charged particle beam device includes a charged particle passage restricting member that has at least one of an arcuate groove and a groove having a longitudinal direction in a plurality of directions, and a deflector that deflects the charged particle discharged toward the groove from the sample. The charged particle discharged from the sample is deflected to a designated position of the groove.

13 Claims, 18 Drawing Sheets

(56) References Cited

U.S. PATENT DOCUMENTS

| | | | | |
|---|---|---|---|---|
| 2013/0299699 A1* | 11/2013 | Nakayama | ............. | G01B 15/00 250/310 |
| 2014/0042338 A1* | 2/2014 | Shibata | .................. | H01J 37/20 250/453.11 |
| 2016/0064178 A1* | 3/2016 | Matsumoto | ........... | H01J 37/045 250/396 R |
| 2016/0379795 A1* | 12/2016 | Watanabe | ............... | H01J 37/21 250/310 |
| 2016/0379798 A1* | 12/2016 | Shishido | ............... | H01J 37/244 250/307 |

* cited by examiner

[Fig. 1A]
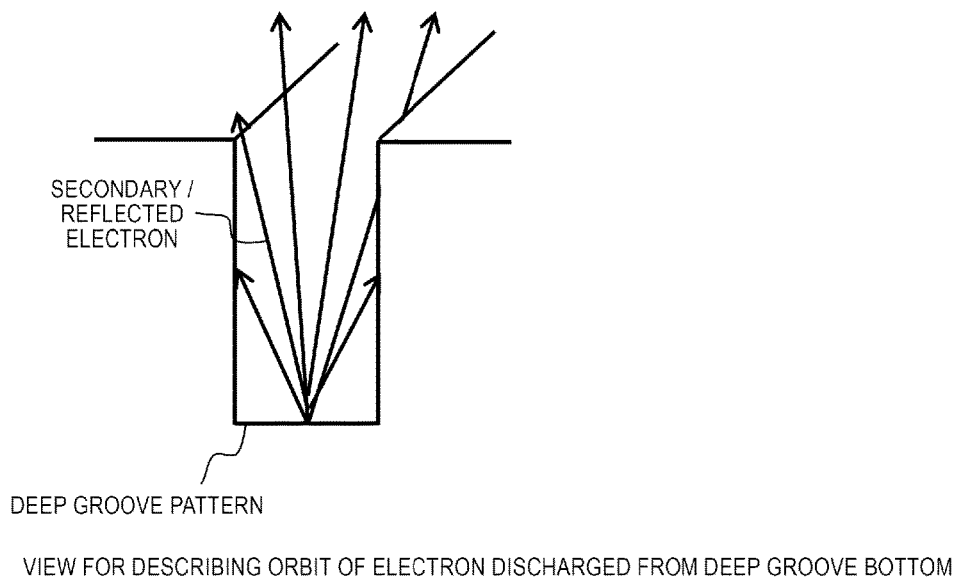
VIEW FOR DESCRIBING ORBIT OF ELECTRON DISCHARGED FROM DEEP GROOVE BOTTOM
[Fig. 1B]
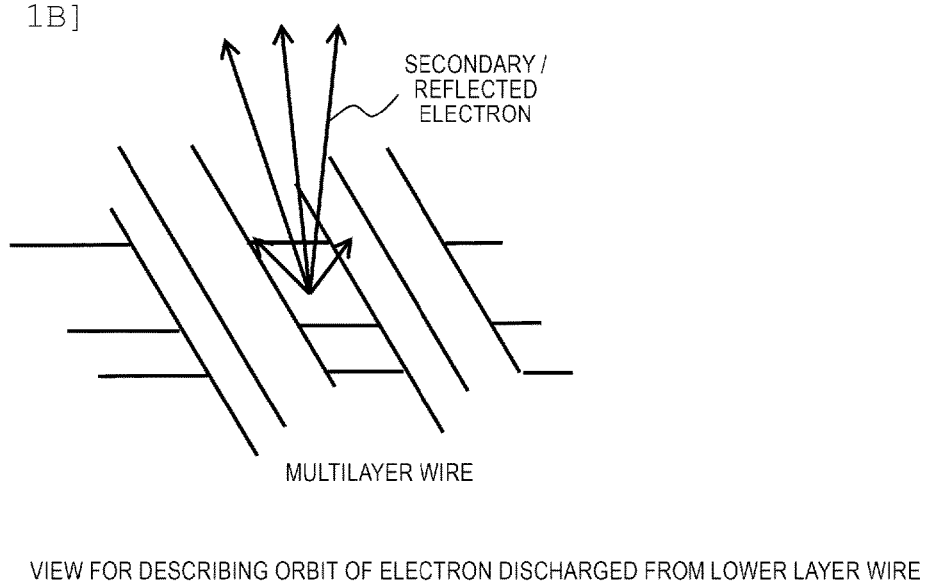
VIEW FOR DESCRIBING ORBIT OF ELECTRON DISCHARGED FROM LOWER LAYER WIRE

[Fig. 2]
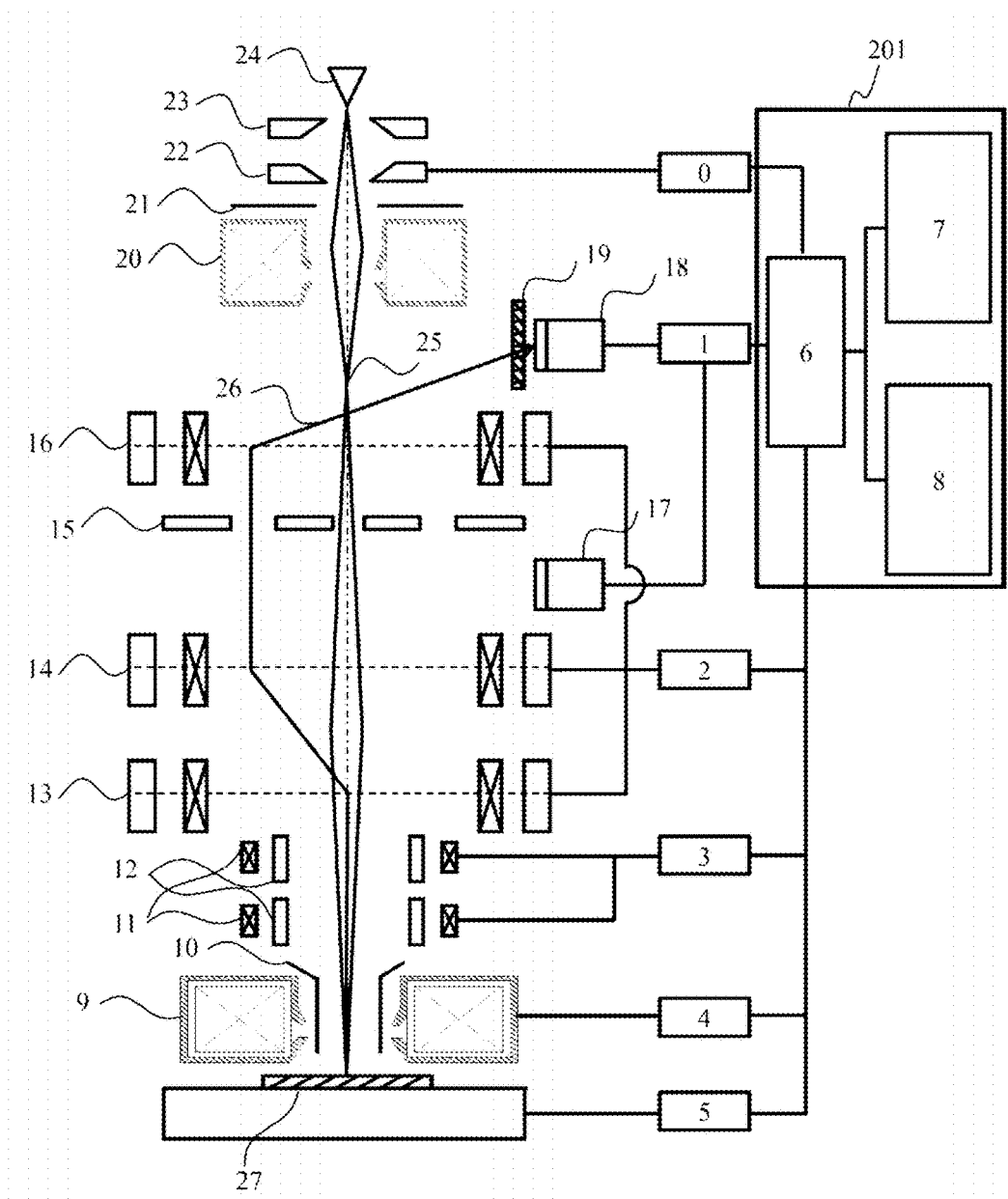

[Fig. 3]
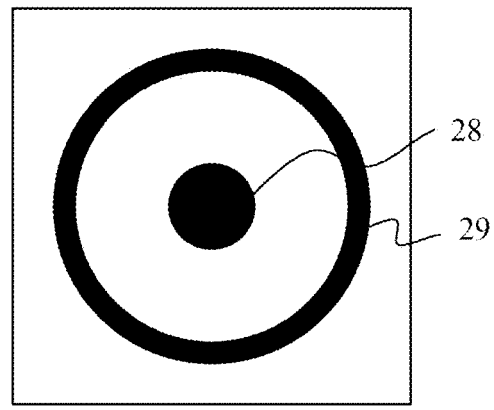
[Fig. 4]
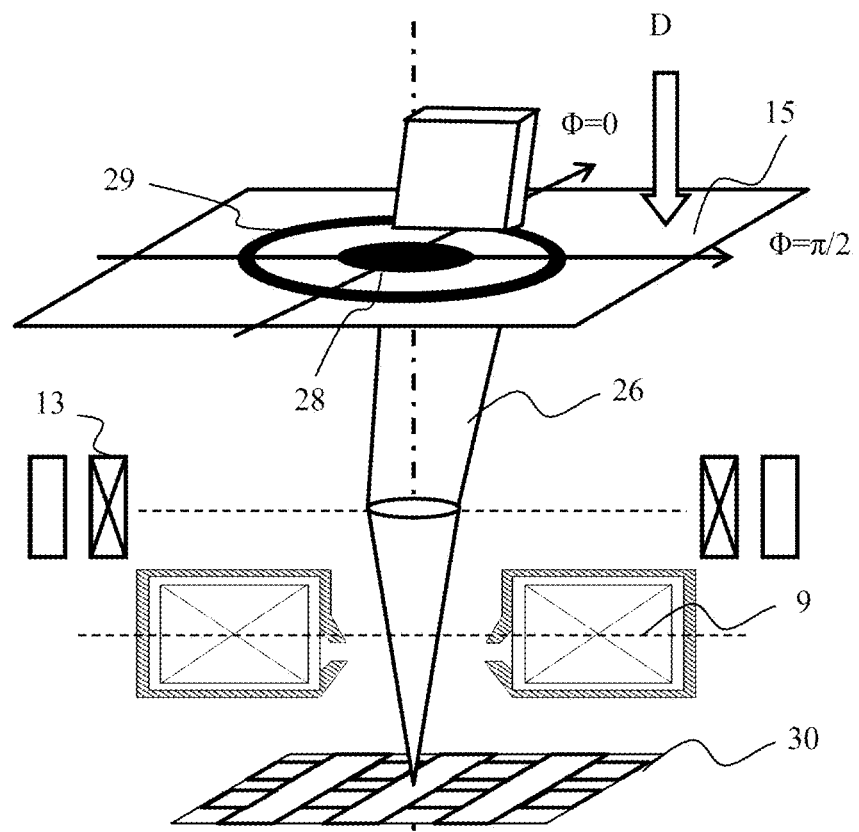

[Fig. 5]
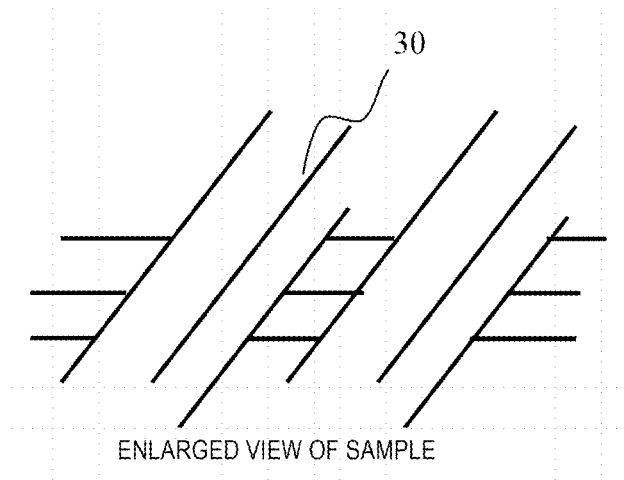
ENLARGED VIEW OF SAMPLE
[Fig. 6]
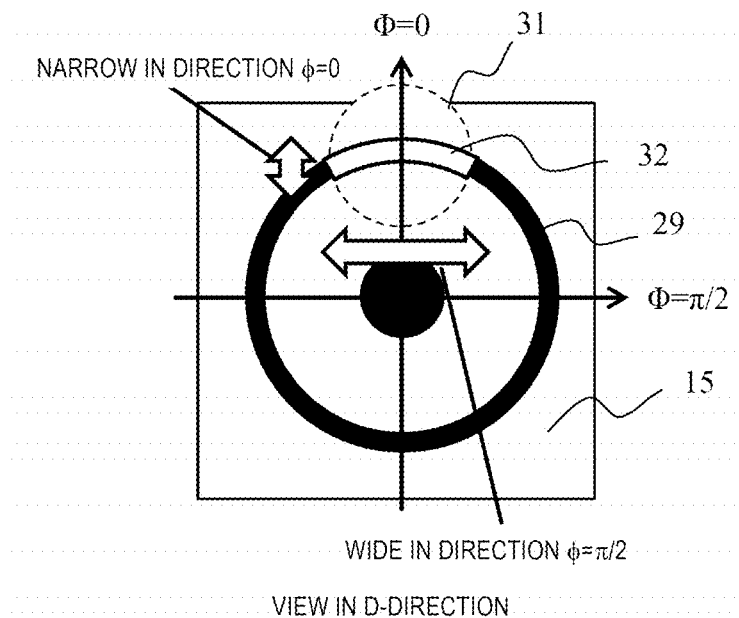
VIEW IN D-DIRECTION

[Fig. 7]
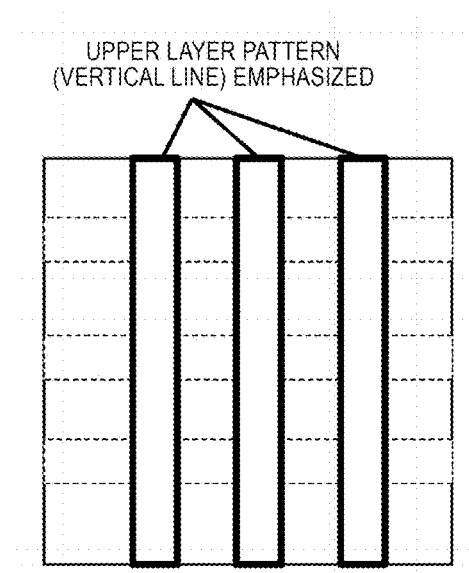
[Fig. 8]
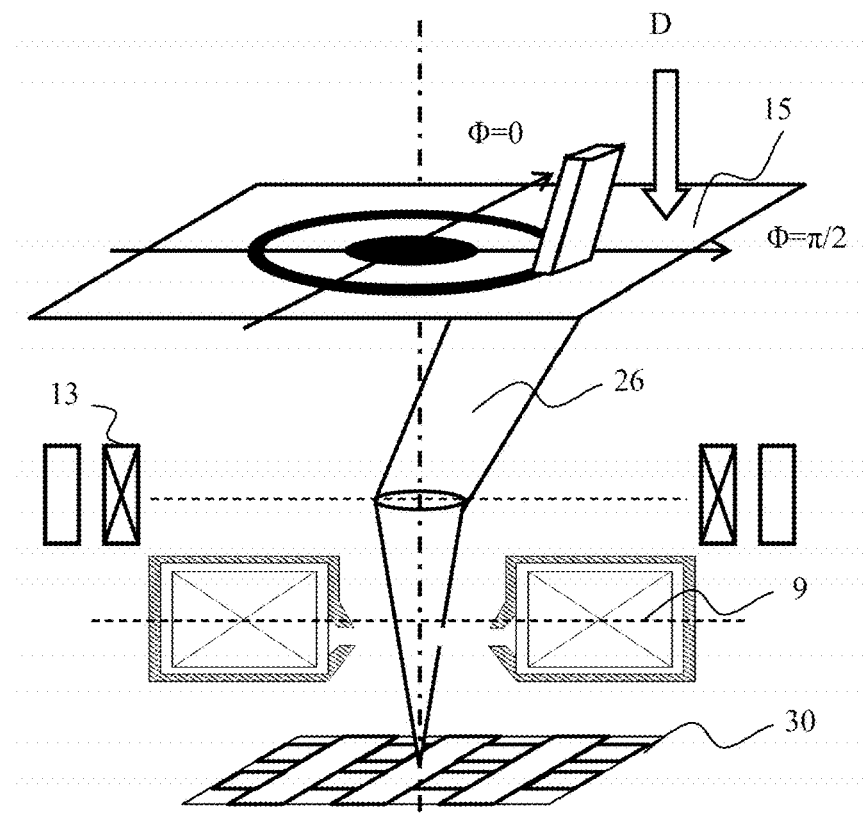

[Fig. 9]
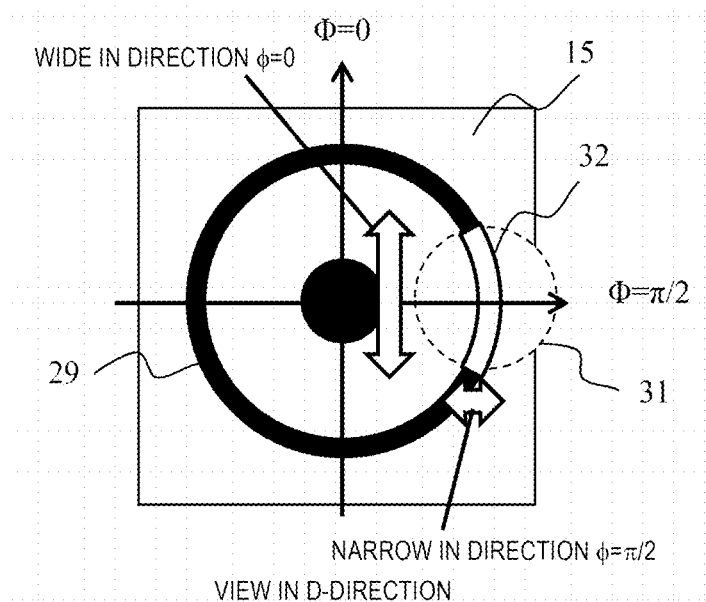
[Fig. 10]
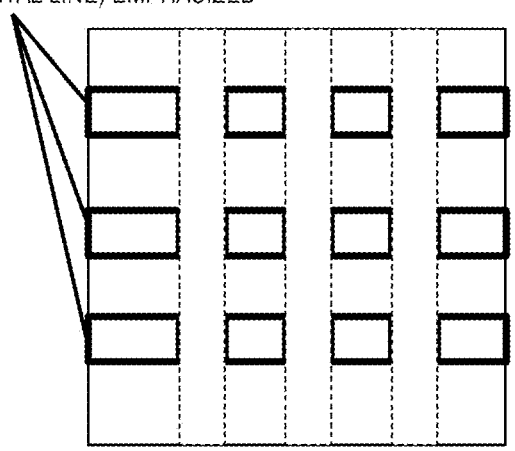

[Fig. 11]
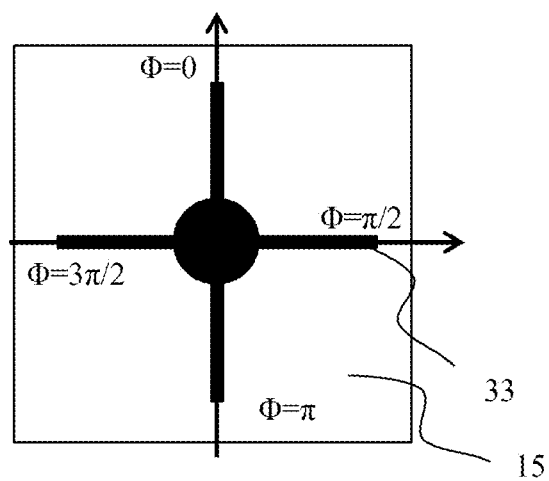
[Fig. 12]
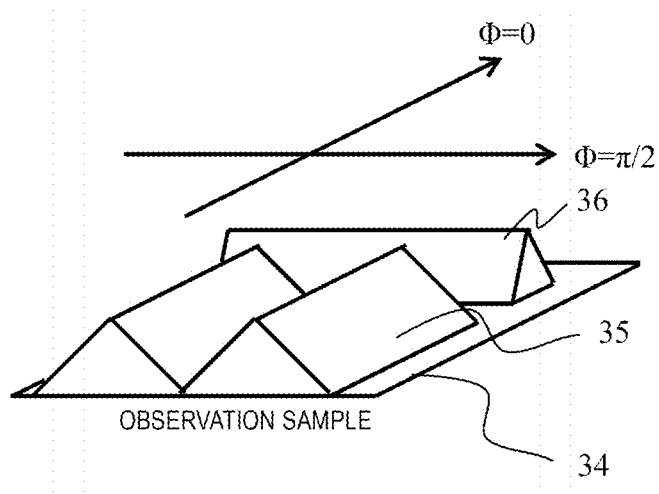

[Fig. 13]
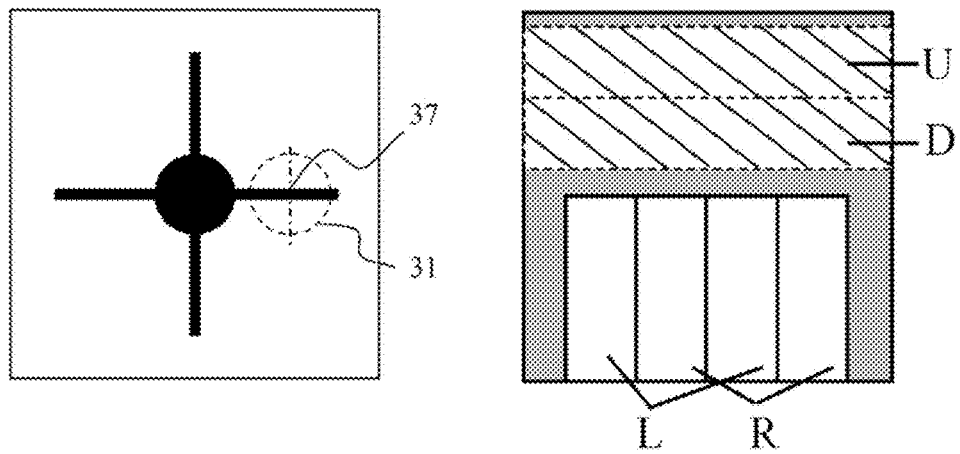
[Fig. 14]
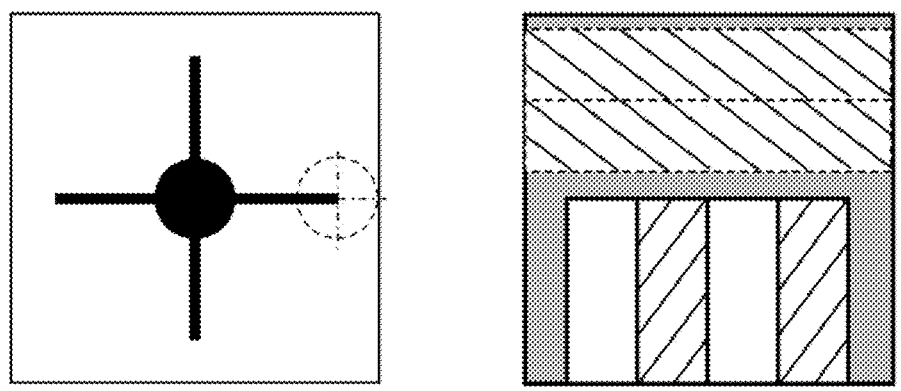
[Fig. 15]
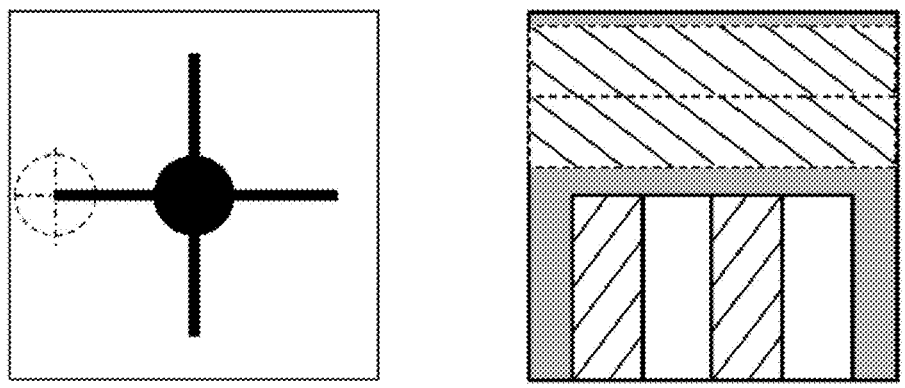

[Fig. 16]
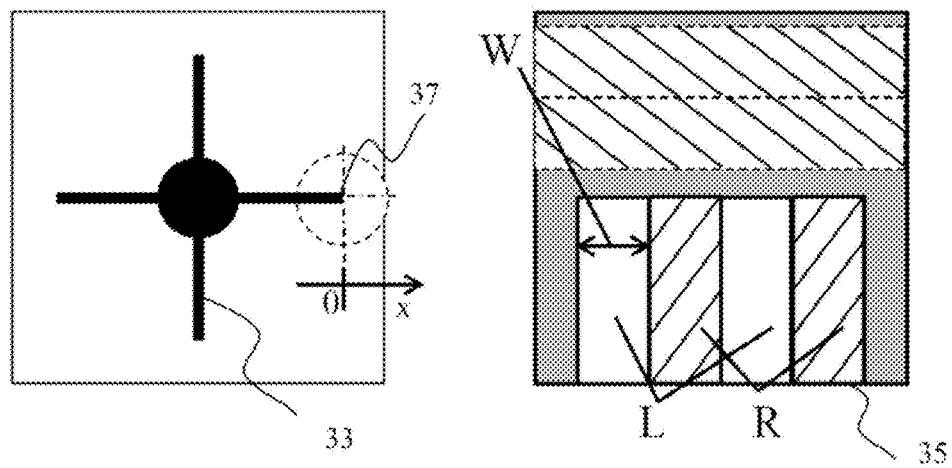
[Fig. 17]
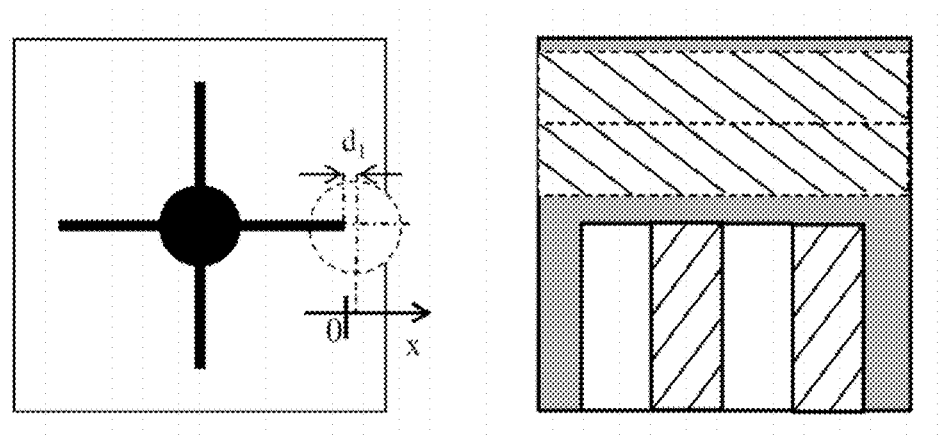
[Fig. 18]
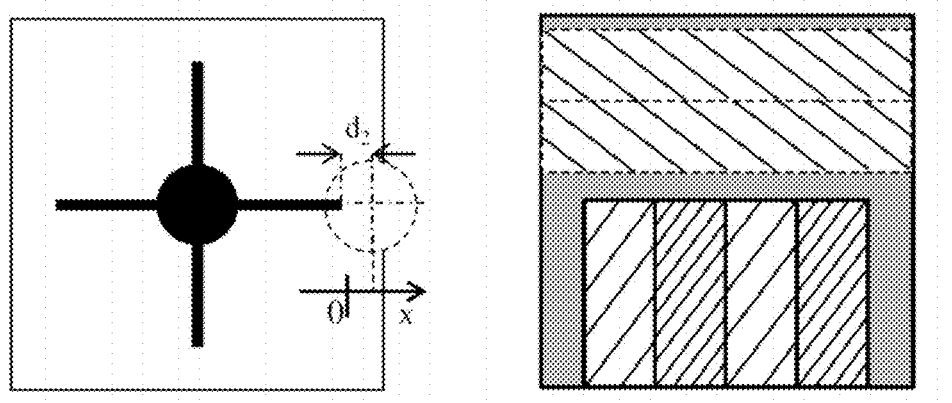

[Fig. 19]
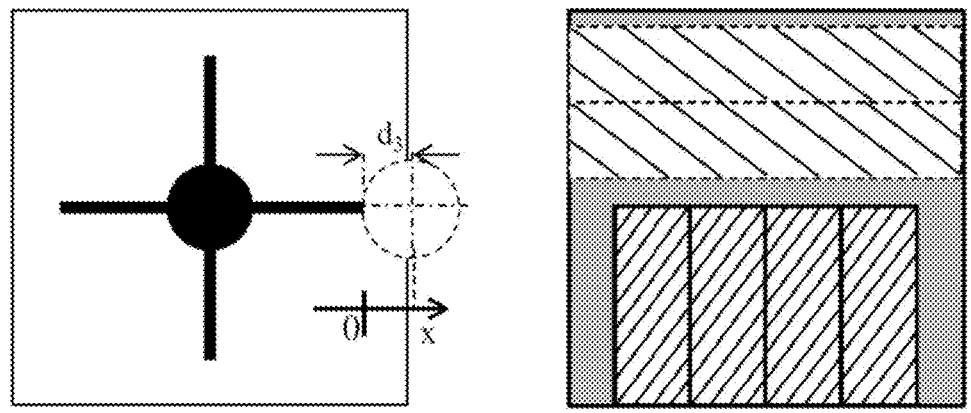
[Fig. 20]
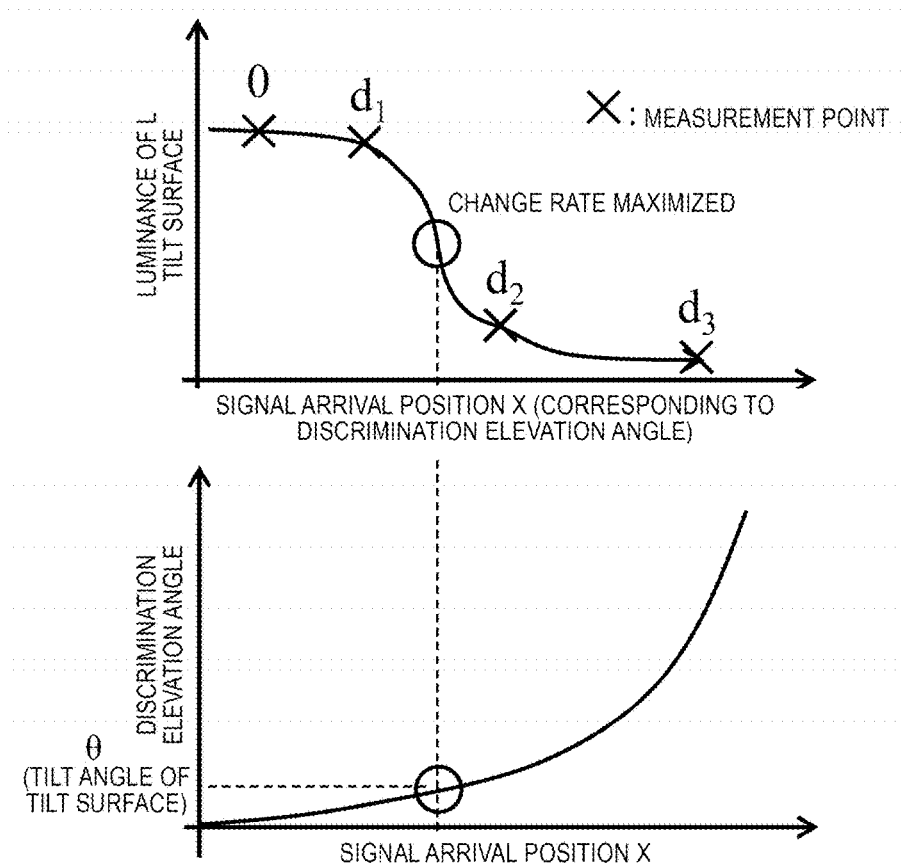

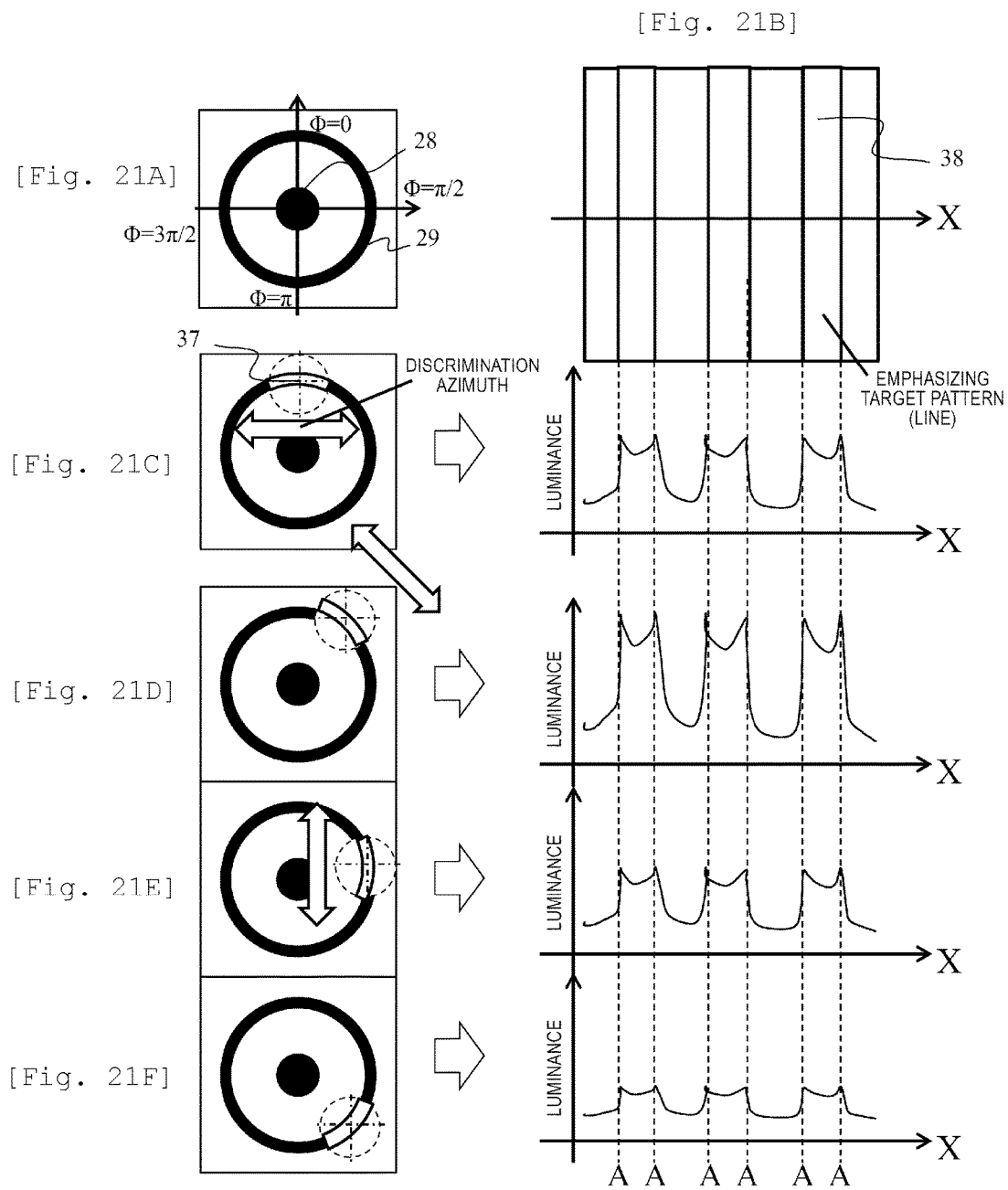

[Fig. 22]
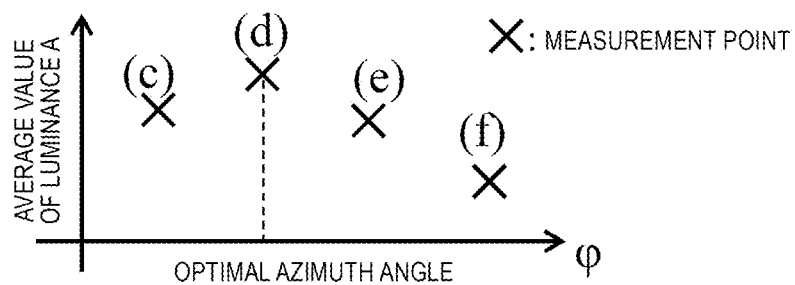
[Fig. 23]
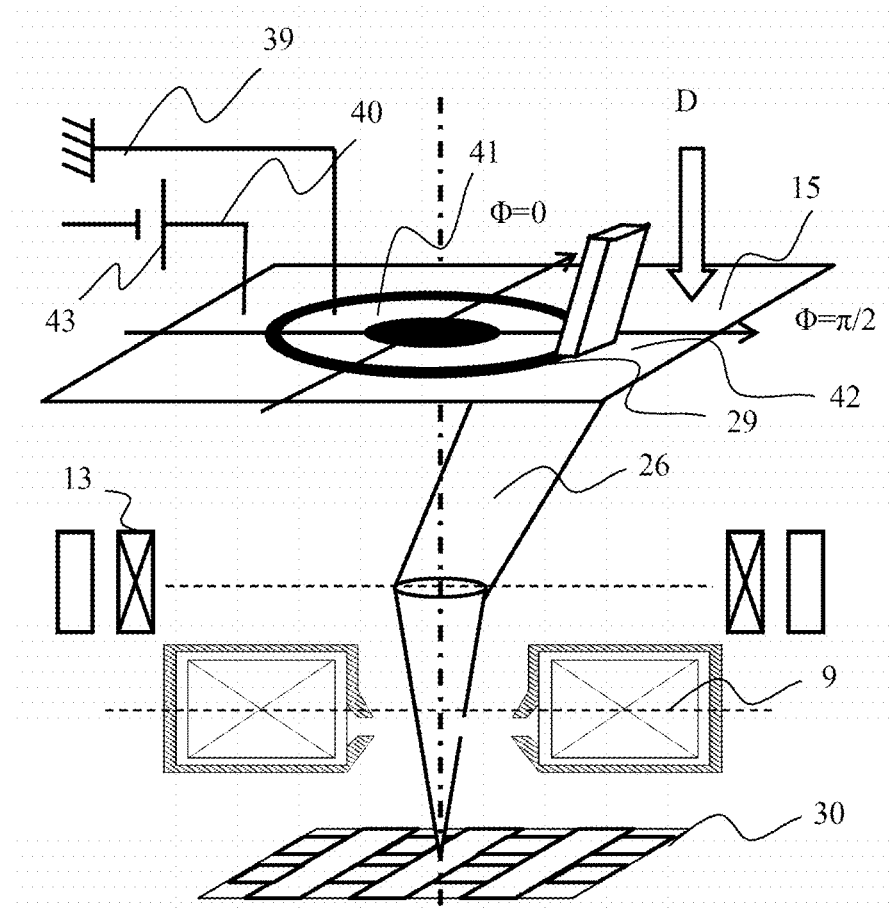

[Fig. 24]
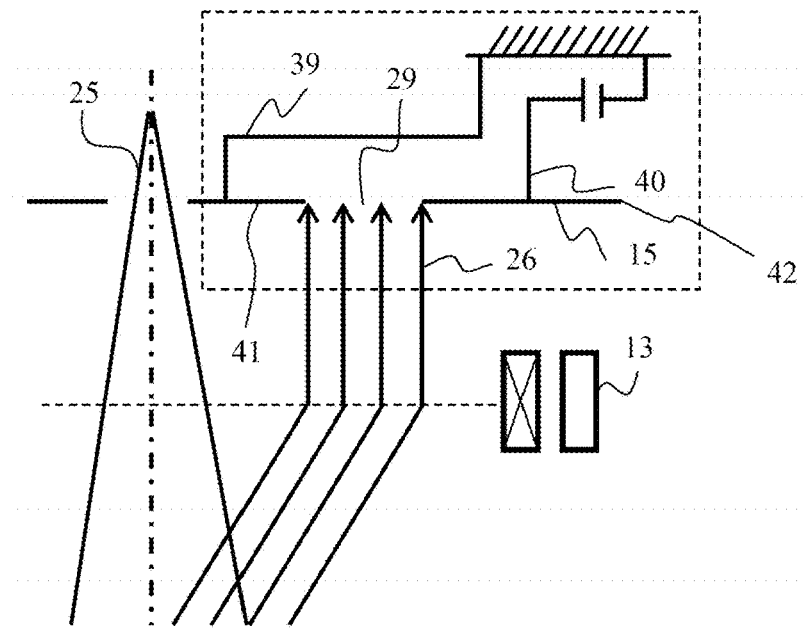
[Fig. 25]
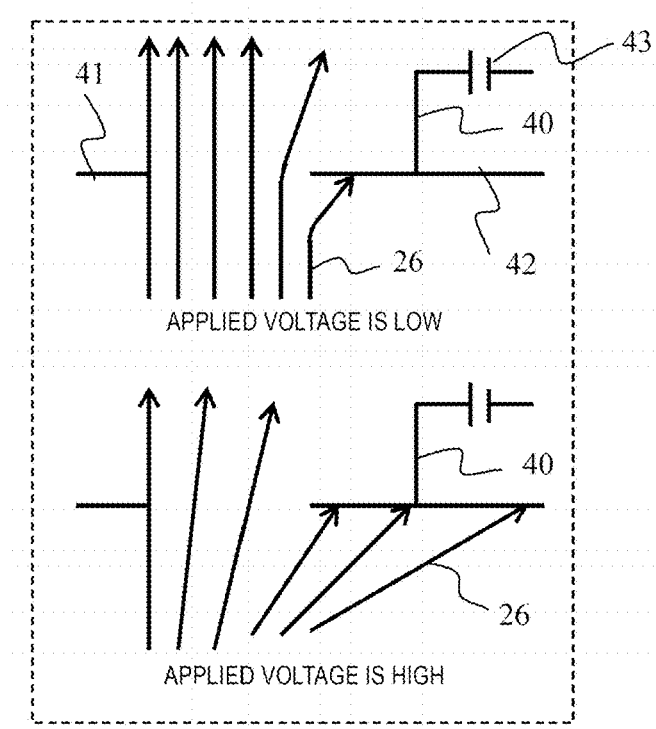
APPLIED VOLTAGE IS LOW
APPLIED VOLTAGE IS HIGH

[Fig. 26]
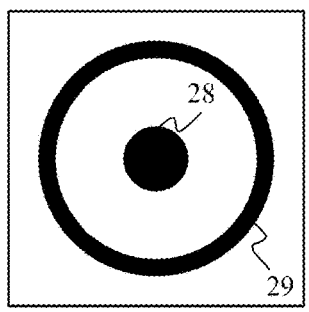
OPENING SHAPE 1
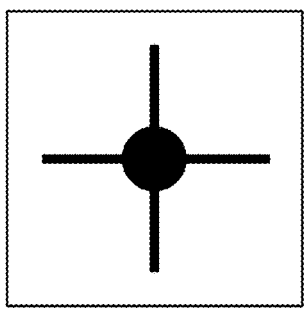
OPENING SHAPE 2
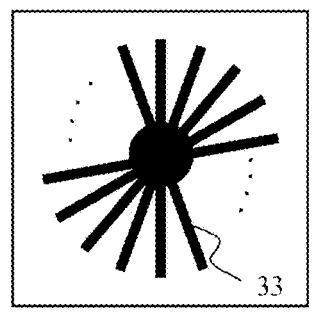
OPENING SHAPE 3
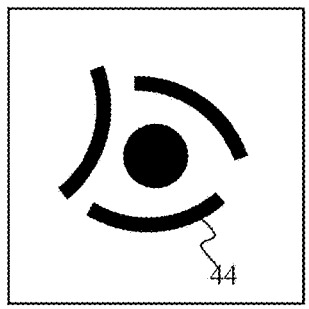
OPENING SHAPE 4
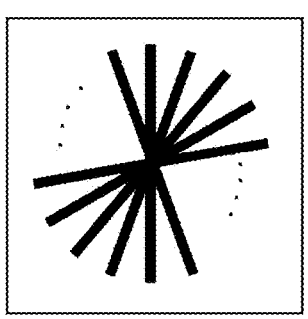
OPENING SHAPE 5
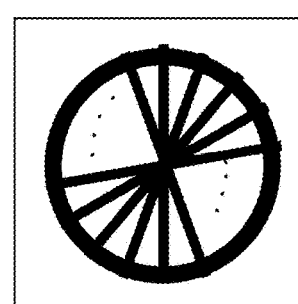
OPENING SHAPE 6
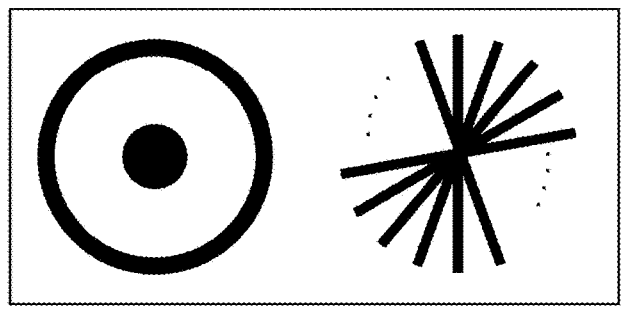
OPENING SHAPE 7

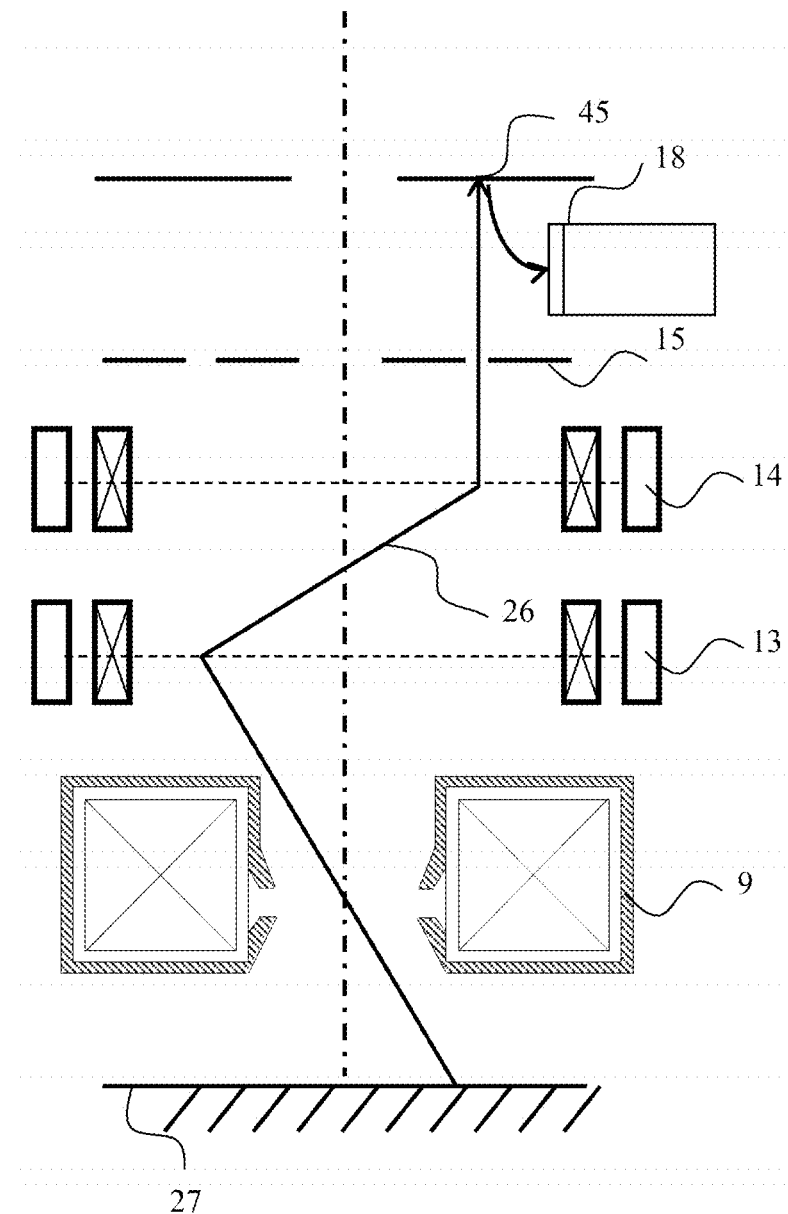
[Fig. 27]

[Fig. 28]
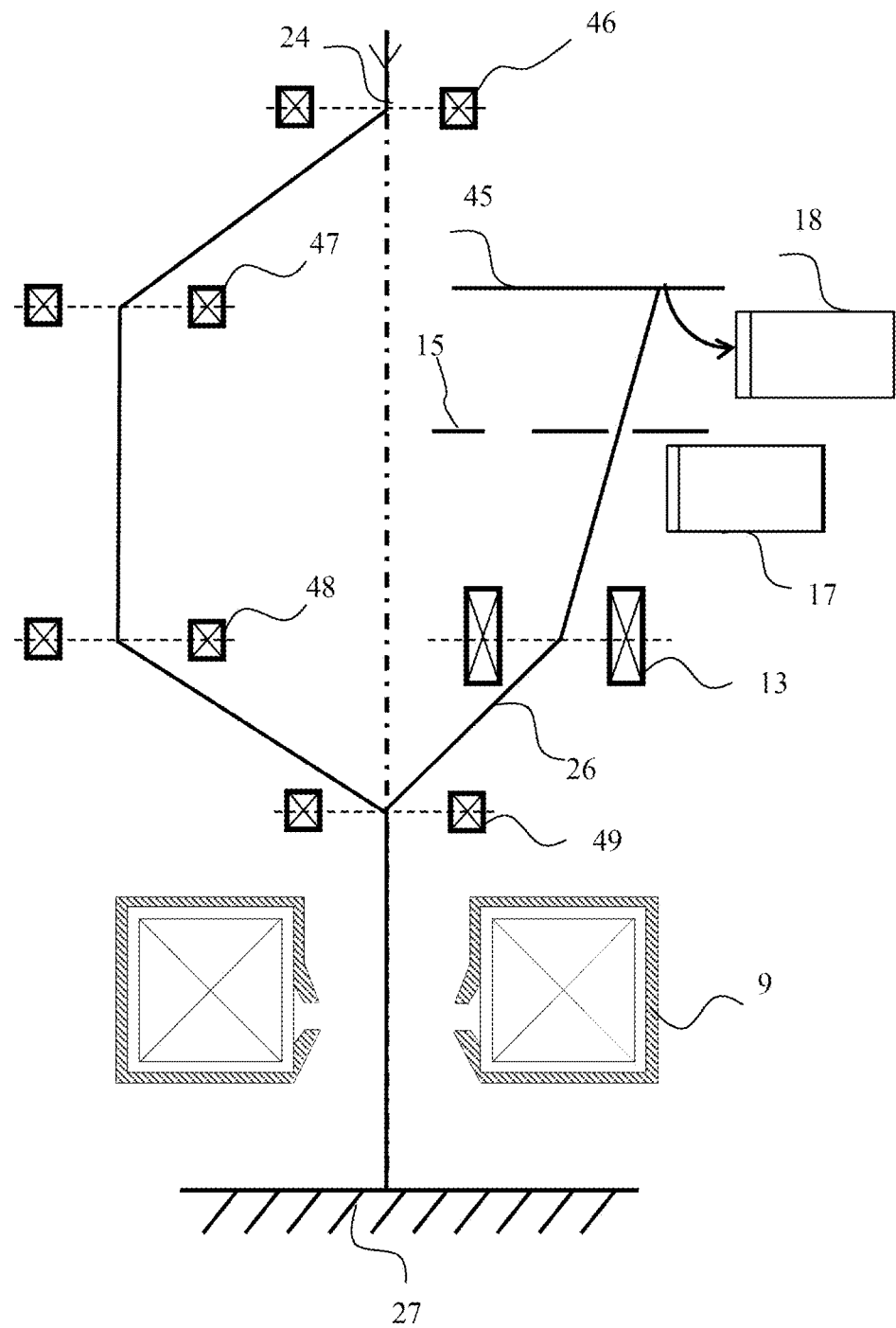

[Fig. 29]
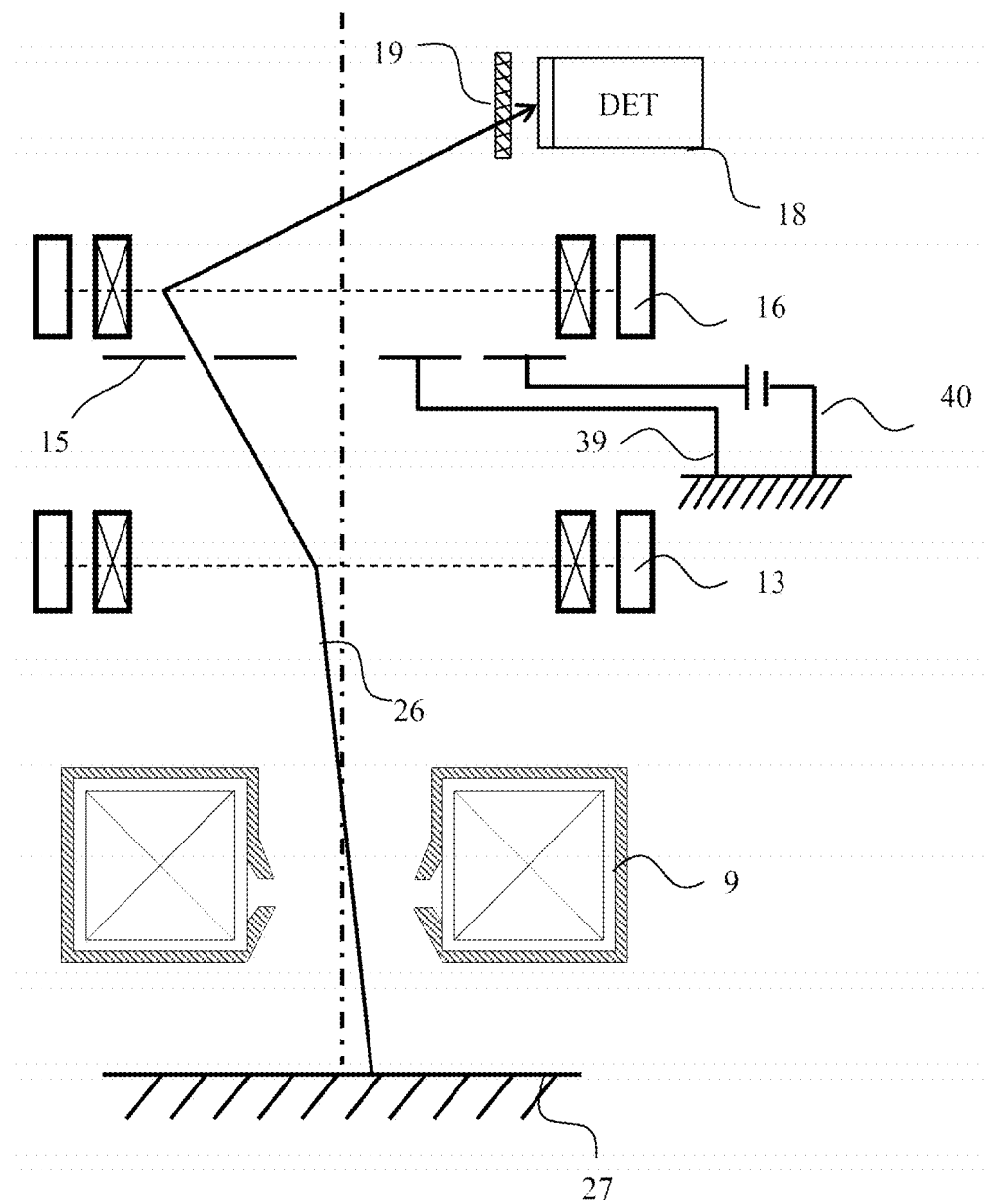

[Fig. 30]
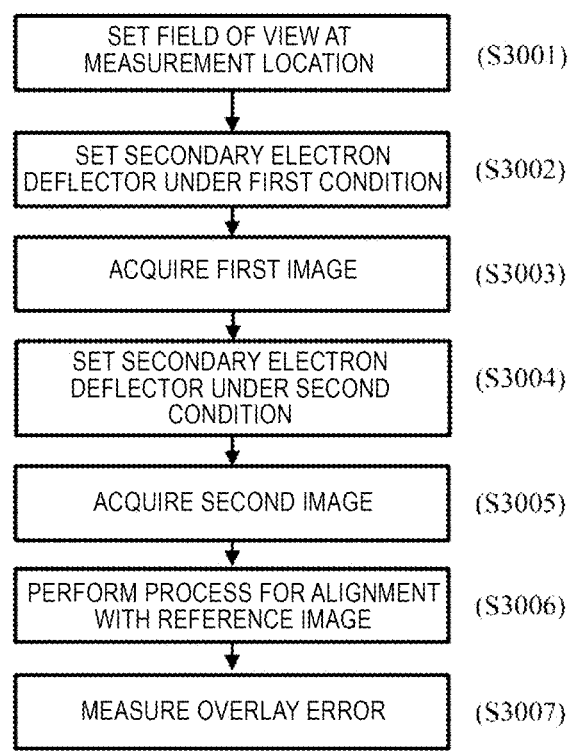

CHARGED PARTICLE BEAM DEVICE

TECHNICAL FIELD

The present invention relates to a charged particle beam device, and particularly relates to a charged particle beam device which can very efficiently detect a charged particle discharged from a deep groove or a multilayer, or a signal obtained based on the charged particle.

BACKGROUND ART

As semiconductor devices have been miniaturized and 3D devices have been widely used, regions such as deep hole patterns where a signal is less likely to be detected have increased. On the other hand, there is a growing need to observe the regions. Therefore, a scanning electron microscope (SEM) used in inspecting and measuring semiconductors requires higher sensitivity and higher accuracy than those in the related art.

The contrast of a deep hole bottom can be emphasized by selectively detecting an electron discharged in a specific direction from electrons discharged from a sample. An electron microscope disclosed in PTL 1 can selectively detect the electron discharged in the specific direction by arranging a plurality of detectors at a target position where an electron beam optical axis serves as a symmetrical axis. In addition, in order to reduce a rotation effect of a signal electron which is caused by an objective lens magnetic field in discriminating the signal electron generated in a detector azimuth, an acceleration electrode is installed in a magnetic field generation region. The signal electron is caused to pass through the region in a state where the signal electron holds high energy. In this manner, azimuth information is stored. PTL 2 discloses an electron microscope in which four detectors are arranged so as to have a relative angle of 90° at a symmetrical position where the electron beam optical axis serves as the symmetrical axis. Since the plurality of detectors are arranged in this way, it is possible to selectively detect the electron discharged in the specific direction. PTL 2 discloses a method in which a sum or a difference between a signal based on the electron discharged in a direction capable of improving the contrast of a lower layer pattern and a signal based on the electron discharged in other directions is output as an image signal.

CITATION LIST

Patent Literature

PTL 1: Japanese Patent No. 5391252 (corresponding U.S. Pat. No. 7,462,828)
PTL 2: Japanese Patent No. 5669896 (corresponding U.S. Pat. No. 9,019,362)

SUMMARY OF INVENTION

Technical Problem

For example, as semiconductor devices have been recently miniaturized, an aspect ratio of a groove-like pattern has increased. In order to improve the contrast of a bottom of the groove-like pattern, it is desirable to selectively detect the electron discharged from the bottom. Therefore, a configuration is required in which the electron discharged from the bottom is very efficiently detected while the electron in an irradiation direction where the electron cannot escape from the bottom is restrained from being detected. Furthermore, according to investigations of the present inventors, in a case of the groove-like pattern, a wall is not present in a longitudinal direction of the pattern. Accordingly, the electron in a direction where the wall is present is restrained from being detected while the electron discharged in the irradiation direction having no wall is more efficiently detected. In this manner, the present inventors have arrived at the conclusion that the improved contrast of the bottom can be realized.

According to the detector disclosed in PTL 1, it is possible to perform discrimination on an orbit of the electron discharged from the sample. However, it is difficult to perform the discrimination suitable for the groove-like pattern. In addition, according to the acceleration electrode disclosed in PTL 1, although a rotation effect of a secondary electron can be restrained to some extent, it is difficult to completely eliminate the rotation effect, and it is difficult to very accurately discriminate the orbit of the electron. In addition, even according to the four direction detectors disclosed in PTL 2, although the discrimination is available to some extent, it is difficult to perform discriminating detection suitable for the groove-like pattern.

Hereinafter, the present inventors propose a charged particle beam device whose object is to improve the contrast of an elongated pattern in a specific direction, such as the groove-like pattern.

Solution to Problem

As an aspect for achieving the above-described object, a charged particle beam device is proposed which includes a detector for detecting a charged particle obtained based on a charged particle beam discharged to a sample. The charged particle beam device includes a charged particle passage restricting member that has at least one of an arcuate groove and a groove having a longitudinal direction in a plurality of directions, a deflector that deflects the charged particle discharged toward the groove from the sample, and a control device that controls the deflector so that the charged particle discharged from the sample is deflected to a designated position of the groove.

Advantageous Effects of Invention

In the charged particle passage restricting member including the arcuate groove or the groove having the longitudinal direction in the plurality of directions, the longitudinal direction of the groove varies depending on a position of the groove. Accordingly, the deflector is used so as to guide an electron discharged from a sample to a proper groove position corresponding to a pattern direction or an optical condition of the charged particle beam device. In this manner, it is possible to realize improved contrast of the bottom of the groove-like pattern.

BRIEF DESCRIPTION OF DRAWINGS

FIGS. 1A and 1B are views for describing an orbit of an electron discharged from a deep groove bottom.

FIG. 2 is a view for schematically describing a scanning electron microscope.

FIG. 3 is a view illustrating an example of a charged particle passage restricting member disposed inside the scanning electron microscope.

FIG. 4 is a view for describing an electron orbit when an electron is deflected to an opening of the charged particle passage restricting member by a deflector which deflects the electron discharged from a sample.

FIG. 5 is a view illustrating an example of a multilayer structure pattern in which an upper layer pattern and a lower layer pattern cross and overlap each other.

FIG. 6 is a view illustrating an electron arrival range when the electron orbit is positioned in the opening of the charged particle passage restricting member.

FIG. 7 is a view illustrating an example of a SEM image on which the upper layer pattern is emphasized.

FIG. 8 is a view for describing the electron orbit when the electron is deflected to the opening of the charged particle passage restricting member by the deflector which deflects the electron discharged from the sample.

FIG. 9 is a view illustrating the electron arrival range when the electron orbit is positioned in the opening of the charged particle passage restricting member.

FIG. 10 is a view illustrating an example of a SEM image on which the lower layer pattern is emphasized.

FIG. 11 is a view illustrating an example of a reflector (charged particle passage restricting member) having a rectangular opening.

FIG. 12 is a view illustrating an example of a sample having a tilt portion.

FIG. 13 is a view illustrating a relationship between an arrival position of an electron arriving at a reflector and a SEM image.

FIG. 14 is a view illustrating a relationship between the arrival position of the electron arriving at the reflector and the SEM image.

FIG. 15 is a view illustrating a relationship between the arrival position of the electron arriving at the reflector and the SEM image.

FIG. 16 is a view illustrating a relationship between the arrival position of the electron arriving at the reflector and the SEM image.

FIG. 17 is a view illustrating a relationship between the arrival position of the electron arriving at the reflector and the SEM image.

FIG. 18 is a view illustrating a relationship between the arrival position of the electron arriving at the reflector and the SEM image.

FIG. 19 is a view illustrating a relationship between the arrival position of the electron arriving at the reflector and the SEM image.

FIG. 20 is a view illustrating a relationship among the arrival position of the electron at the reflector, luminance, and a pattern tilt angle.

FIGS. 21A-21F are views illustrating a relationship between the arrival position of the electron at the reflector including an annular opening and a signal waveform.

FIG. 22 is a graph illustrating a relationship between the arrival position of the electron at the reflector including an annular opening and the luminance.

FIG. 23 is a view illustrating an example of the reflector provided with an energy filtering function.

FIG. 24 is a view illustrating an example of the reflector to which a power source for energy filtering is connected.

FIG. 25 is a view for describing an orbit change in the electron when a voltage applied to the reflector is changed.

FIG. 26 is a view illustrating an example of the reflector which has at least one of an arcuate groove and a groove having a longitudinal direction in a plurality of directions.

FIG. 27 is a view illustrating an example of an electron optics system in which a secondary electron is deflected in a direction orthogonal to the deflector by a double stage electron deflector.

FIG. 28 is a view illustrating an example of the electron optics system in which an electron beam and a secondary electron orbit are deflected so as to be separated from an ideal optical axis of the electron beam.

FIG. 29 is a view illustrating an example of the electron optics system in which the electron passing through the reflector is directly deflected to a detector.

FIG. 30 is a flowchart illustrating an overlay error measurement process.

DESCRIPTION OF EMBODIMENTS

One of reasons that a deep groove bottom or a lower layer pattern region is less likely to be detected is that an electron generated from a groove bottom/lower layer is less likely to arrive at a surface. FIG. 1 illustrates the behavior of a signal electron generated in a deep groove. The signal electron generated from the deep groove bottom is distributed in a fixed elevation angle range. The electron having a large elevation angle (electron having a large relative angle between a beam optical axis and an irradiation direction) naturally collides with a groove side wall. Consequently, the electron does not arrive at the surface, and thus, cannot be detected. For example, in a case where an aspect ratio (hole depth/hole width) is approximately 50, if the elevation angle is 88° or smaller on geometric calculation, the signal electron collides with the side wall. In this way, the absolute number of electrons arriving at the surface decreases. Accordingly, it is difficult to detect the groove bottom.

However, with regard to the deep groove, the side wall is not present in an extending direction of the groove. Thus, signals discharged along a longitudinal direction of the groove can be detected without any loss. Accordingly, it is possible to achieve improved contrast by discriminating or emphasizing a signal component in an azimuth thereof. For the same reason, an azimuth causing less signal loss is also present in the lower layer pattern extending in one direction in a multilayer. Therefore, it is an effective way to discriminate or emphasize the signal in the azimuth.

More specifically, if it is possible to selectively detect the electron in a long orbit range extending in a specific direction instead of merely discriminating an electron orbit, it is possible to block the electron discharged in a direction which hinders contrast improvement of a desired observation pattern while restraining poor efficiency in detecting the electron discharged from an edge of the desired observation pattern.

Embodiments described hereinafter relate to a charged particle beam device which can improve the contrast of a bottom of a groove-like pattern or a lower layer wire in a multilayer, which is elongated in a specific direction.

For example, embodiments described hereinafter propose a charged particle beam device including a deflector which deflects a charged particle discharged from a sample. The charged particle beam device includes a member including an opening which is disposed between a charged particle source and a deflector so as to restrict passage of the charged particle discharged from the sample, and an arithmetic device which processes a detection signal acquired based on the charged particle discharged from the sample and passing through the opening. The deflector is adjusted so that the charged particle discharged from the sample is deflected to a first position of the opening and a second position of the opening which is different from the first position. The arithmetic device processes a first detection signal obtained when the charged particle is deflected to the first position, and a second detection signal obtained when the charged particle is deflected to the second position.

According to the above-described configuration, a signal electron limiting opening and the deflector are combined with each other. In this manner, without receiving any limitation of mounting places of the detector or optical conditions used for observation, it is possible to discriminate the signal electron in any optional azimuth angle direction. Accordingly, with regard to the sample whose signal electron yield is high in a specific azimuth such as the groove bottom or the lower layer pattern in the multilayer, even if the azimuth is any direction, it is possible to obtain an improved image such as improved contrast by discriminating the azimuth angle.

Embodiment 1

FIG. 2 is a view illustrating an example of an electron optics system of a scanning electron microscope according to an aspect of the charged particle beam device. The electron optics system includes an electron source 24, an objective lens 9, a sample (semiconductor wafer) 27, an acceleration electrode 10 placed to face the sample, secondary electron deflectors 13, 14, and 16, a scanning deflector for primary electron beam deflecting 12, an image shift coil 11, detectors 17 and 18 installed between the electron source and the objective lens 9, and a reflector 15 which restricts the signal electron (secondary electron or backscattered electron).

In addition, the scanning electron microscope illustrated in FIG. 2 includes a lead electrode 23 for extracting the electron from the electron source 24, an acceleration electrode 22 for accelerating the electron extracted by the lead electrode 23, a condenser lens 20 for focusing a primary beam (electron beam) 25 accelerated by the acceleration electrode 22, the image shift coil (image shift deflector) 11 for deflecting a field of view to any optional position in the field of view position on the sample, the scanning deflector 12 for scanning the sample 27 with the beam in a one-dimensional or two-dimensional manner, and the rear stage acceleration electrode 10 to which a positive voltage for accelerating the primary beam 25 is applied. Furthermore, the scanning electron microscope illustrated in FIG. 2 includes an acceleration voltage control power source 0, a signal processing unit 1 for processing a detection signal obtained by the detector, a deflector control power source 2 for controlling the secondary electron deflector, a deflector control power source 3 for controlling the deflector of the primary beam 25, an objective lens control power source 4, and a retarding power source 5 for controlling arrival energy of the primary beam 25 at the sample 27 by adjusting a negative voltage applied to the sample.

An optical element of the scanning electron microscope is controlled by a control device 201. The control device 201 supplies a signal required for controlling the scanning electron microscope to a control power source of the optical element, and processes a signal obtained by the detector. In addition, the control device 201 causes a frame memory to store the signal of the detector in synchronization with the scanning deflector supplied to the scanning deflector 12, thereby generating an image signal. The control device 201 includes a control unit 6, an image processing unit (arithmetic processing unit) 7, and a data storage unit 8. Based on control conditions stored in the data storage unit 8, the control unit 6 supplies a control signal to each power source, and transmits a detection signal to the image processing unit 7. The image processing unit 7 performs data processing based on measurement conditions or arithmetic conditions stored in the data storage unit 8. Specific control content, measurement content, or arithmetic content of the control device 201 will be described later.

Here, the secondary electron deflector is a deflector whose deflecting targets are all of the signal electrons in a range from secondary electrons to reflected electrons in a high energy band. The detectors 17 and 18 are vertically installed across the reflector 15. The secondary electron deflectors 13 and 14 are disposed on the sample side from the reflector 15, and control an arrival position of the signal electron discharged from the sample arriving at the reflector. The arrival position can be located at any optionally designated position by the control of the control device 201.

The signal electron passing through the opening of the reflector 15 after being discharged from the sample is deflected toward the detector 18 by the secondary electron deflector 16. FIG. 2 illustrates the detector 18 as a detector which directly detects the signal electron passing through the reflector (signal electron orbit selecting member). However, without being limited thereto, for example, the detector may detect an electron which is newly generated as a result of the signal electron colliding with a separately provided reflector.

In order to generate the Wien condition for selectively deflecting the signal electron without deflecting an electron beam (primary beam 25), the secondary electron deflectors 13, 14, and 16 employ a deflector (Wien filter) which generates an orthogonal electromagnetic field. Here, FIG. 3 illustrates a representative example of an opening shape of the reflector 15. As illustrated in FIG. 3, the reflector 15 (charged particle passage restricting member) has a passage hole 28 for allowing the primary beam to pass therethrough, and an annular opening 29, separately from the passage hole 28.

The electron discharged from the sample is deflected toward the annular opening 29 by the secondary electron deflectors 13 and 14. In this manner, the electrons discharged from the sample are divided into electrons passing through the annular opening 29 and electrons colliding with the reflector 15. If it is assumed that the orbit of the electron discharged from the sample has a range of a certain degree, the annular opening 29 selectively allows the passage of the electron which is elongated in a specific direction (longitudinal direction (circumferential direction) of the opening of the annular opening in a case of the annular opening 29 in FIG. 3) and which falls within an orbit range whose shape can approximate a rectangular shape. Hereinafter, a signal selecting method using an orbit selecting member having the annular opening as illustrated in FIG. 3 will be described with reference to FIGS. 4 to 10.

FIG. 4 is a view for describing an example in which the secondary electron deflector 13 controls an arrival position of the signal electron arriving at the reflector 15 having the annular opening 29. Referring to FIGS. 4 to 7, an example will be described in which edge contrast is improved in an upper layer pattern (vertical line) of a semiconductor device having a multilayer structure.

First, as illustrated in FIG. 4, a signal electron 26 discharged from a sample in the multilayer is deflected in a direction ϕ=0 of the annular opening 29 of the reflector 15 by the secondary electron deflector 13. FIG. 5 is an enlarged view of a sample 30. As illustrated in FIG. 6, the signal electron arriving at the reflector 15 spreads to a fixed range in the reflector 15. For a spread 31 of the arriving signal electron, the annular opening 29 is operated so as to function as a rectangular slit which is narrow in a direction $\phi=0$ and is wide in the direction $\phi=\pi/2$.

Here, the electron discharged from a line edge of a vertical line tends to spread in the direction $\phi=\pi/2$ due to generation efficiency thereof or a relationship thereof in a reflected direction. Conversely, the electron generated from an edge of a horizontal line tends to spread in the direction $\phi=0$. Accordingly, whereas signals of the vertical line edge can easily pass through an aperture, many signals of the horizontal line edge are cut off in the annular opening. As a result, a SEM image generated based on the signal electron after passing through the annular opening 29 has an upper layer pattern (vertical line) emphasized as illustrated in FIG. 7.

Referring to FIGS. 8 to 10, an example will be described in which edge contrast is improved in the lower layer pattern (horizontal line) of the semiconductor device having the multilayer structure. First, as illustrated in FIG. 8, the signal electron 26 discharged from the sample in the multilayer is deflected in the direction $\phi=\pi/2$ of the annular opening 29 of the reflector 15 by the secondary electron deflector 13. In a case of the signal electron arriving at the reflector 15, as illustrated in FIG. 9, for the spread 31 of the signal electron, the annular opening 29 is operated so as to function as a rectangular slit which is wide in the direction $\phi=0$ and is narrow in the direction $\phi=\pi/2$. Accordingly, in the example in FIG. 8, many signals of the vertical line edge are cut off in the annular opening, and the signals of the horizontal line edge can be very efficiently detected. Therefore, the acquired SEM image has the lower layer pattern (horizontal line) emphasized as illustrated in FIG. 10.

Particularly in a case of using the secondary electron deflector of the Wien filter, even if the signal electron orbit is deflected, the orbit of the primary beam is not changed. Accordingly, without causing position misalignment in the observation field of view, it is possible to detect the signal for emphasizing an edge in a specific direction.

As described with reference to FIGS. 4 to 10, it is possible to generate images which respectively emphasize the upper layer pattern and the lower layer pattern in the multilayer structure pattern by adjusting deflecting conditions of the deflector. Therefore, it is possible to compare positions using respectively emphasized images with each other. More specifically, it is possible to measure an overlay error by using the image having the emphasized upper layer pattern, the image having the emphasized lower layer pattern, and a reference image. FIG. 30 is a flowchart illustrating a process of measuring the overlay error by using an electron microscope having the electron optics system as illustrated in FIG. 2.

First, a semiconductor wafer is introduced into a vacuum container of an electron microscope (not illustrated). Thereafter, a field of view (FOV) of the electron microscope is located at a desired measurement position (Step 3001). As a first deflecting condition, a condition of the secondary electron deflector is set (Step S3002), and a first image is acquired (Step S3003). For example, the first deflecting condition is a deflecting condition suitable for acquiring an image whose vertical line is emphasized. Next, as a second deflecting condition, a condition of the secondary electron deflector is set (Step S3004), and a second image is acquired (Step S3005). For example, the second deflecting condition is a deflecting condition suitable for acquiring an image whose horizontal line (lower layer pattern) is emphasized.

Next, a reference image is read from a storage medium (not illustrated), and a process for aligning the first image and the second image with each other is performed (Step 3006). For example, the reference image is a pattern image generated based on design data (layout data) of the semiconductor device. Multilayer patterns are arranged under an ideal arrangement condition. The reference image on which the process for aligning with the first image is performed may be subject to image processing in which the edge of the upper layer pattern is relatively emphasized compared to that of the normal reference image. The reference image on which the process for aligning with the second image is performed may be subject to image processing in which the edge of the lower layer pattern is relatively emphasized compared to that of the normal reference image. Based on the alignment in a layer unit as described above, relative misalignment ($\delta x1$, $\delta y1$) obtained based on the process for alignment between the first image and the reference image and relative misalignment ($\delta x2$, $\delta y2$) obtained based on the process for alignment between the second image and the reference image are obtained. For example, ($\delta x2-\delta x1$, $\delta y2-\delta y1$) is solved, thereby measuring an overlay error (Step 3007).

According to the above-described method, in a state where the same field of view is scanned, it is possible to acquire both the image whose lower layer pattern is emphasized and the image whose upper layer pattern is emphasized. Accordingly, it is possible to very accurately measure the overlay error. In addition, as long as sufficient contrast can also be obtained from the normal SEM image for the upper layer pattern without adjusting the secondary electron deflector, the overlay error may be measured by using two images of the normal image and the image acquired under the deflecting condition for relatively emphasizing the lower layer pattern.

The above-described process is performed by automatically controlling the electron microscope, based on a preset operation program (recipe). The above-described arithmetic expression is stored in a predetermined storage medium. The arithmetic operation is automatically performed in accordance with a predetermined instruction, and a measurement result is output. The control device 201 (arithmetic processing unit) illustrated in FIG. 2 performs the above-described process in accordance with the operation program. The above-described process is performed in a case where the deflecting condition for emphasizing the edge of the upper layer pattern and the deflecting condition for emphasizing the edge of the lower layer pattern are determined in advance. However, in a case where the deflecting condition under which the edge can be emphasized is unknown, the contrast of the edge of the layer pattern to be emphasized may be evaluated for each of a plurality of deflecting conditions. In this manner, the deflecting condition under which the contrast is most improved or the deflecting condition whose value reaches a predetermined value or greater may be found out.

In the above-described example, a case has been described where the positions in the field of view are the same as each other between the first deflecting condition and the second deflecting condition. However, the overlay error may be measured by acquiring the images obtained under the first deflecting condition and the second deflecting condition after changing the positions of the field of view (first position in the field of view and second position in the field of view). For example, in a case where the upper layer pattern and the lower layer pattern are arrayed within a wide range in the same state, even if the positions in the field of view are changed, substantially the same image is acquired. If the relative position relationship between the upper layer and the lower layer is not changed over the wide range, even if the positions in the field of view are changed, it is possible to very accurately measure the overlay error by using the above-described method. In addition, according to this method, it is possible to restrain a beam irradiation amount per unit area. Therefore, it is possible to reduce the charge-up influence.

Referring to FIGS. 4 and 8, an example has been described in which the orbit of the electron discharged from the sample is deflected in the azimuth angle direction φ=0 or φ=π/2. However, the orbit of the signal electron can be controlled so as to be deflected to any optional position of the annular opening 29. Accordingly, it is possible to discriminate various orbits depending on a pattern shape. In addition, as an example of the opening shape of the reflector 15, the annular opening 29 has been described. However, as long as the opening shape has the longitudinal direction for the spread of the signal electron, the same function can be fulfilled. Hereinafter, embodiments in a case of using the reflector having the opening shape other than the shape of the annular opening will be described.

Embodiment 2

In the present embodiment, an example will be described in which the azimuth of the signal electron is discriminated using the reflector having a rectangular opening. FIG. 11 illustrates the reflector 15 having the rectangular opening. The reflector 15 includes a rectangular opening 33 having a long side parallel to the directions φ=0 and φ=π/2. In order to describe an advantageous effect in discriminating the signal orbit by using this reflector, as illustrated in FIG. 12, an observation sample 34 is used which has surfaces tilting in directions φ=0, π and φ=π/2, 3π/2 (tilt surface 35 and tilt surface 36).

First, the secondary electron deflector 13 is controlled so that the rectangular opening 33 is located at a position illustrated in FIG. 13, thereby controlling to adjust a signal electron central orbit arrival position 37. The right drawing in FIG. 13 illustrates a SEM image acquired in this case. As illustrated, the electron in the azimuth angle directions φ=π/2, 3π/2 can pass through the opening 33. Accordingly, the contrast of both left and right (LR) tilt surfaces 35 is emphasized. Next, as illustrated in FIG. 14, the signal electron arrival position 37 is controlled to be close a right side end surface of the rectangular opening 33. In this case, in the electrons generated in the directions φ=π/2, 3π/2, the electron generated in the direction φ=π/2 is cut off in the rectangular opening 33. Accordingly, as illustrated in the right drawing in FIG. 14, on the SEM image configured to include the electrons in the direction 3π/2 which can pass through the rectangular opening 33, only the left (L) side tilt surfaces 35 is emphasized. In FIG. 14, a flat surface is excluded, and a region having oblique lines illustrates a relatively darker region compared to a region having no oblique line.

FIG. 15 is a view illustrating an example in which the signal electron arrival position 37 is located on a left end surface of the rectangular opening 33. Based on the same principle as that in FIG. 14, now, it is possible to emphasize only the right (R) direction of the tilt surface 35. In a case of using the reflector having the rectangular opening 33 in this way, it is possible to discriminate the azimuths φ//, φ//+π parallel to the longitudinal (long side) direction of the opening. In addition, if a terminal end portion in the longitudinal direction is used, one side of the azimuths φ//, φ//+π can be further cut off. Filtering is performed using not only the side of the rectangular shape in the longitudinal direction but also the short side. In this manner, it is possible to increase variations in the azimuth angle for discriminating the azimuth angle. Here, if the rectangular opening is manufactured for a plurality of azimuths, it is possible to secure the discriminated azimuth similarly to the annular opening shape.

The reflector which has an arcuate shape illustrated in Embodiment 1 or Embodiment 2, or the reflector in which the groove having the longitudinal direction in the plurality of directions is open is employed. Accordingly, it is possible to optimize edge contrast in accordance with the pattern formed direction.

Embodiment 3

In the present embodiment, an example will be described in which a tilt angle is measured using the same configuration as that according to Embodiment 2. FIGS. 16 to 20 are views illustrating an example in which a tilt angle on the left (L) side of the tilt surface 35 is measured. First, the signal electron arrival position 37 is located at a position illustrated in FIG. 16. An image obtained under a deflecting condition illustrated in the left drawing in FIG. 16 is an image in which the left (L) side of the tilt surface 35 is emphasized as illustrated in the right drawing in FIG. 16. If the image is acquired while the signal electron arrival position is sequentially moved in the x-direction from here in the order of FIG. 16, FIG. 17, FIG. 18, and FIG. 19, the number of electrons which can pass therethrough decreases. Accordingly, luminance at the left (L) position on the tilt surface 35 is gradually degraded.

FIG. 20 is a graph illustrating a relationship between a signal electron arrival position x and luminance of a left tilt surface. In accordance with a change in the signal electron arrival position x, the luminance of the L tilt surface is changed. However, the change is not uniform, and a rapidly changing region is present. The reason is that elevation angle direction distribution of a secondary/reflected electron generated on the tilt surface depends on a tilt angle of the tilt surface. In particular, the reflected electron is likely to be discharged in a direction perpendicular to the tilt surface. Therefore, if the signal electron arrival position 37 is deflected to a position where the electron holding an elevation angle component perpendicular to the tilt surface is cut off at the end of the rectangular opening 33, the number of detected electrons decreases rapidly.

That is, in accordance with the tilt angle, the signal electron arrival position having rapidly changing luminance is changed. Accordingly, as illustrated in the lower drawing in FIG. 20, a relationship between the signal arrival position x and the tilt angle of the tilt surface is recognized in advance so as to obtain the electron arrival position x (∞ deflecting signal) having the rapidly changing luminance. In this manner, it is possible to calculate a tilt angle θ of the tilt surface. For example, the relationship between the signal electron arrival position x and the discriminating elevation angle (or tilt angle of the tilt surface) can be found out in such a way that the tilt angle of the tilt surface is measured in advance by using an atomic force microscope (AFM) or a transmission electron microscope (TEM) and the maximum change position x of the luminance of the tilt surface is detected. The above-described tilt angle and the maximum change position x (or deflecting signal information in this case) are associated with each other and stored. In this manner, based on the detection of the maximum change position x, it is possible to obtain the tilt angle. In addition, a relationship between both of these may be expressed by a function so as to store the function. In addition, it is possible to find out the relationship, based on an orbit simulation result during the signal electron tilting. In addition, in a case where a tilt surface width W of the SEM image illustrated in FIG. 16 and the tilt angle θ obtained according to the present embodiment can be obtained, a height H of the tilt surface can be obtained by solving H=W×tan θ. This arithmetic expression is registered in a recording medium in advance. In this manner, based on an output of the electron microscope, the tilt angle θ or the pattern height H can be obtained.

Embodiment 4

In the present embodiment, a scanning electron microscope will be described which can specify a proper signal arrival position according to a measurement purpose (deflecting condition of the secondary electron deflector). The present embodiment is particularly effective in a case where a focusing condition of the objective lens is strong and the orbit of the electron discharged from the sample is greatly rotated. FIG. 21 is a view for describing an example of determining an optimal azimuth angle so that the contrast of the vertical line pattern is most emphasized. As illustrated in FIG. 21 (a), the present embodiment employs the annular opening 29 as an opening shape of the reflector. FIG. 21(b) illustrates the vertical line pattern of an observation target.

First, in a case where there is no rotation effect caused by a magnetic field of the objective lens, the signal electron arrival position 37 is located in the direction ϕ=0 (position in FIG. 21(c)) in which it is considered that the contrast of the vertical line pattern is most emphasized. Then, luminance distribution in the X-direction is obtained from the acquired SEM image. Next, the signal electron arrival position 37 is located in a direction ϕ=π/4 (position in FIG. 21(d)). A profile of the acquired SEM image in the X-direction is obtained. Furthermore, the signal electron is located in the directions ϕ=π/2 (FIG. 21(e)), ϕ=3π/4 (FIG. 21(f)). Similarly, the profiles in the X-direction are sequentially acquired.

FIG. 22 is a graph illustrating a relationship between a plurality of azimuth angles and an average luminance value at an edge position A. It is understood that the average luminance value in the direction ϕ=π/4 (FIG. 21(d)) is the greatest compared to other azimuth angles. Accordingly, when the vertical line is emphasized, if the direction ϕ=π/4 (FIG. 21(d)) is discriminated, it is possible to determine that the direction shows the optimal azimuth angle. Here, in the present embodiment, the average luminance value is measured while the azimuth is changed as much as π/4 within ϕ=0 to 3π/4. However, as a matter of course, the optimal point may be determined by more finely changing the azimuth angle, or the optimal point may be estimated from an approximate curve connecting measurement points. In addition, instead of an absolute value at a peak position of the profile as described above, a condition under which a luminance difference value between a peak and a base line becomes greatest may be selected. Even if the peak position of the edge portion is high, if other portions' luminance is high, it is not possible to very accurately extract the edge position in some cases. Therefore, a condition under which the contrast is maximized may be selected.

Furthermore, an operation program for selecting the above-described device conditions is stored in advance. Based on an instruction of the operation program, the electron microscope is controlled or image processing is performed. In this manner, the semiconductor device can be automatically measured.

Embodiment 5

In the present embodiment, an example will be described in which capability of discriminating the azimuth angle direction is improved by applying a voltage to the reflector. FIG. 23 is a view illustrating an example in which voltage supply lines 39 and 40 are respectively connected to an inner annular member 41 and an outer member 42 of the reflector 15. An inner opening of the inner annular member 41 serves as a passage opening of the primary beam 25. Accordingly, the inner annular member 41 is grounded so that an electric field does not affect the beam. A voltage is applied to the outer member 42 by a power source 43 via the voltage supply line 40.

FIGS. 24 and 25 are views for describing a change in an electron orbit when the voltage is applied to the outer member 42. In a case where the voltage applied to the outer member 42 is low when the signal electron 26 is deflected to the annular opening 29 by the secondary electron deflector 13, the signal electron of the orbit close to the outer member 42 side is selectively attracted to the outer member 42, and collides with the reflector. On the other hand, in a case where the voltage applied to the outer member 42 is high, the electron of the orbit close to the inner annular member 41 is also attracted due to an electrostatic force of the applied voltage, and collides with the reflector. That is, it is understood that a slit width of the annular opening 29 can be changed by the applied voltage. In this manner, without being limited to a shape of the opening 29 of the reflector, it is possible to adjust discriminating capability.

In the present embodiment, the reflector 15 is installed thereon so as to surround an optical axis, and thus, the inner annular member 41 is grounded. However, in a case where the reflector 15 is installed out of the orbit of the primary beam, any optional voltage can be applied to the inner annular member 41. In addition, instead of the reflector including the annular opening as illustrated in FIG. 23, the voltage can be applied to the reflector including the rectangular opening.

Embodiment 6

In the present embodiment, a reflector having various shape openings will be described. FIG. 26 is a view for describing various reflectors. An opening shape 3 shows a reflector which has the rectangular opening 33 in multiple directions, and which can discriminate the azimuth angle similarly to the annular opening shape. An opening shape 4 is a shape in which the annular opening 29 is divided into three portions and in which the opening is moved so that a portion 44 of the annular opening is close to the primary beam passage hole 28. Since the opening is moved closer, it is possible to minimize a drive voltage and a current when the signal electron is deflected to a desired opening in the secondary electron deflector. An opening shape 5 has a structure in which a primary beam passage hole is removed from the opening shape 3. An opening shape 6 is a combination between the annular opening 29 and the rectangular opening 33. An opening shape 7 shows a reflector in which a plurality of opening shape examples are combined with each other.

The opening shape of the above-described reflector is employed in order to generate a discharged electron orbit having a rectangular shape (or a shape approximate to the rectangular shape) by restricting a portion of the orbit range of the electron discharged from the sample. As long as the discharged electron having this rectangular shape can be generated, the opening shape is not limited to the examples in FIG. 26. The arcuate opening as illustrated in FIG. 26 or the radially arrayed rectangular opening is disposed so as to provide the deflector which can locate the orbit of the secondary electron at any optional position (designated position) of the opening. In this manner, in accordance with a pattern formed direction or an optical condition of the electron microscope, it is possible to set the device conditions for optimizing the contrast of the pattern elongated in a fixed direction such as the groove-like pattern. Owing to the reflector having the opening having the longitudinal direction in which the orbit of the discharged electron can be formed in a rectangular shape, it is possible to improve the contrast of the elongated pattern such as the groove-like pattern.

Embodiment 7

FIG. 27 is a view illustrating an example of an optical system of the electron microscope. The optical system illustrated in FIG. 27 employs a secondary electron deflector of two stages. An orbit of the signal electron 26 is vertically incident on the reflector 15. Since the signal electron 26 is deflected in this way, it is possible to reduce a spread (spread into an elliptical shape) of the signal electron on the reflector which is caused by the tilt. Therefore, it is possible to improve resolution in discriminating the azimuth angle.

FIG. 28 is a view illustrating an example of the optical system in which the reflector 15 is installed out of the optical axis. In this example, a primary beam 24 is deflected out of the optical axis by using a deflector 46, and the primary beam 24 is caused to return to the optical axis again by using deflectors 47, 48, and 49. In addition, the deflector 49 functions not only to deflect the primary beam 24 incident out of the axis so as to extend along the optical axis, but also to deflect the electron discharged from the sample in a direction opposite to the orbit out of the axis of the primary beam 24. The discharged electron deflected by the deflector 49 is further deflected by the secondary electron deflector 13, and is incident on an azimuth angle discriminating opening of the reflector 15. In this manner, it is no longer necessary to form the primary beam passage hole 28 in the reflector 15. According to this configuration, it is possible to restrain orbit discriminating capability from being degraded due to a fact that the electron discharged from the sample passes through the primary beam passage opening disposed in the reflector. In addition, in the present example, the primary beam is deflected out of the axis, thereby separating the orbit of the primary beam and the orbit of the electron discharged from the sample. However, as long as the signal electron can be deflected, using the Wien filter, to a region where the reflector 15 having no primary beam passage hole can be installed, the optical system as illustrated in FIG. 27 may be employed.

FIG. 29 is a view illustrating an example of the optical system in which the signal electron 26 after passing through the reflector 15 is directly incident on the detector 18. The signal electron 26 passing through the reflector 15 is deflected by the secondary electron deflector 16 so as to be directly incident on the detector 18. An energy filter 19 is installed in front of the detector 18. In this manner, it is possible to further discriminate energy of the signal electron 26 whose orbit is previously discriminated. The reflected electron having high energy is suitably used in observing a three-dimensional shape of the sample, based on a scattering characteristic of the reflected electron.

REFERENCE SIGNS LIST

0: ACCELERATION VOLTAGE CONTROL POWER SOURCE,
1: SIGNAL PROCESSING UNIT,
2: DEFLECTOR CONTROL POWER SOURCE,
3: DEFLECTOR CONTROL POWER SOURCE,
4: OBJECTIVE LENS CONTROL POWER SOURCE,
5: RETARDING POWER SOURCE,
6: CONTROL UNIT,
7: IMAGE PROCESSING UNIT,
8: DATA STORAGE UNIT,
9: OBJECTIVE LENS,
10: REAR STAGE ACCELERATION ELECTRODE,
11: IMAGE SHIFT COIL,
12: SCANNING DEFLECTOR,
13: SECONDARY ELECTRON DEFLECTOR I,
14: SECONDARY ELECTRON DEFLECTOR II,
15: REFLECTOR (OPENING SHAPE OF DISCRIMINATING AZIMUTH ANGLE),
16: SECONDARY ELECTRON DEFLECTOR III,
17: DETECTOR I,
18: DETECTOR II,
19: ENERGY FILTER,
20: CONDENSER LENS,
21: APERTURE,
22: LEAD ELECTRODE,
23: LEAD ELECTRODE,
24: ELECTRON SOURCE,
25: PRIMARY BEAM,
26: SECONDARY/REFLECTED ELECTRON ORBIT,
27: SAMPLE,
28: PRIMARY BEAM PASSAGE HOLE,
29: ANNULAR OPENING,
30: MULTILAYER PATTERN,
31: SPREAD OF SIGNAL ELECTRON ON REFLECTOR,
32: OPENING PASSAGE ELECTRON,
33: RECTANGULAR OPENING,
34: OBSERVATION SAMPLE,
35: TILT SURFACE IN DIRECTION OF $\Phi=\pi/2$,
36: TILT SURFACE IN DIRECTION OF $\Phi=0$,
37: CENTRAL ORBIT SIGNAL ELECTRON ARRIVAL POSITION,
38: SAMPLE (VERTICAL LINE PATTERN),
39: INNER VOLTAGE SUPPLY LINE OF ANNULAR OPENING,
40: OUTER VOLTAGE SUPPLY LINE OF ANNULAR OPENING,
41: INNER SIDE OF ANNULAR OPENING FORMING MEMBER,
42: OUTER SIDE OF ANNULAR OPENING FORMING MEMBER,
43: POWER SOURCE,
44: PORTION OF ANNULAR OPENING,
45: REFLECTOR,
46: DEFLECTOR

The invention claimed is:

1. A charged particle beam device including a detector for detecting a charged particle obtained based on a charged particle beam discharged to a sample, comprising:
a charged particle passage restricting member that has at least one of an arcuate groove and a groove having a longitudinal direction in a plurality of directions;

a deflector that deflects the charged particle discharged toward the groove from the sample; and a control device that controls the deflector so that the charged particle discharged from the sample is deflected to a designated position of the groove.

2. The charged particle beam device according to claim 1, wherein the control device controls the deflector so that the charged particle discharged from the sample is deflected to a plurality of positions of the groove.

3. The charged particle beam device according to claim 2, wherein the plurality of positions are positions where directions are different in the longitudinal direction of the groove.

4. The charged particle beam device according to claim 3, wherein the control device generates at least one of an image and a signal waveform obtained at each of the plurality of positions, based on a detection result of the charged particle discharged from the sample.

5. The charged particle beam device according to claim 4, wherein the control device obtains an overlay error between two patterns, based on a signal obtained at each of the plurality of positions.

6. The charged particle beam device according to claim 4, wherein the control device selects a deflecting condition of the deflector, based on an evaluation of the image or the signal waveform.

7. The charged particle beam device according to claim 1, wherein the charged particle passage restricting member including the arcuate groove includes an inner member that has a passage opening for the charged particle beam, and an outer member that is disposed via the inner member and the arcuate groove.

8. The charged particle beam device according to claim 7, wherein a power source for applying an adjustable voltage is connected to the outer member.

9. The charged particle beam device according to claim 1, wherein in the grooves having the longitudinal direction in the plurality of directions, the grooves are radially arrayed.

10. The charged particle beam device according to claim 1, wherein the control device includes an arithmetic device that processes a signal obtained based on the charged particle which passes through the groove after being discharged from the sample.

11. A charged particle beam device including a detector for detecting a charged particle obtained based on a charged particle beam discharged to a sample, comprising:

a charged particle passage restricting member that has a groove-like opening;

a deflector that deflects the charged particle discharged toward the groove from the sample along the groove; and a control device that processes an output of the detector under each deflecting condition of the deflector.

12. The charged particle beam device according to claim 11, wherein the control device detects a change in luminance of a specific portion inside a scanning region, based on an output of the detector.

13. The charged particle beam device according to claim 12, wherein the control device obtains a tilt angle of the specific portion by using a relational expression in which information of the luminance is associated with the tilt angle of the specific portion, or by referring to a table storing the information of the luminance associated with the tilt angle of the specific portion.

* * * * *